(12) United States Patent
Miya et al.

(10) Patent No.: US 8,029,622 B2
(45) Date of Patent: *Oct. 4, 2011

(54) SUBSTRATE PROCESSING APPARATUS, LIQUID FILM FREEZING METHOD AND SUBSTRATE PROCESSING METHOD

(75) Inventors: Katsuhiko Miya, Kyoto (JP); Naozumi Fujiwara, Kyoto (JP); Akira Izumi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 116 days.

This patent is subject to a terminal disclaimer.

(21) Appl. No.: 11/837,575

(22) Filed: Aug. 13, 2007

(65) Prior Publication Data

US 2008/0060686 A1 Mar. 13, 2008

(30) Foreign Application Priority Data

Sep. 13, 2006 (JP) .................................. 2006-248181

(51) Int. Cl.
*B08B 5/00* (2006.01)
(52) U.S. Cl. .................. 134/4; 134/30; 134/31; 134/33; 134/37; 134/902
(58) Field of Classification Search .................. 134/94.1, 134/105, 902, 4, 26, 30, 31, 33
See application file for complete search history.

(56) References Cited

U.S. PATENT DOCUMENTS

| | | | |
|---|---|---|---|
| 4,817,652 A | 4/1989 | Liu et al. | |
| 4,962,776 A | 10/1990 | Liu et al. | |
| 5,857,474 A * | 1/1999 | Sakai et al. | 134/102.3 |
| 5,934,566 A | 8/1999 | Kanno et al. | |
| 5,997,653 A * | 12/1999 | Yamasaka | 134/2 |
| 6,048,409 A | 4/2000 | Kanno et al. | |
| 6,444,582 B1 | 9/2002 | Tsai | |
| 6,488,779 B1 | 12/2002 | Lohmueller | |

(Continued)

FOREIGN PATENT DOCUMENTS

EP 0 423 761 4/1991

(Continued)

OTHER PUBLICATIONS

Office Action issued Nov. 7, 2008 in corresponding Chinese Patent Application No. 200710127899.3.

(Continued)

*Primary Examiner* — Michael Barr
*Assistant Examiner* — Benjamin Osterhout
(74) *Attorney, Agent, or Firm* — Ostolenk Faber LLP

(57) ABSTRACT

A cooling gas is discharged from a cooling gas discharge nozzle toward a local section of a front surface of a substrate on which a liquid film is formed. And then the cooling gas discharge nozzle moves from a rotational center position of the substrate toward an edge position of the substrate along a moving trajectory while the substrate is rotated. As a result, of the surface region of the front surface of the substrate, an area where the liquid film has been frozen (frozen area) expands toward the periphery edge from the center of the front surface of the substrate. It is therefore possible to form a frozen film all over the front surface of the substrate while suppressing deterioration of the durability of the substrate peripheral members since a section receiving supply of the cooling gas is limited to a local area on the front surface of the substrate.

4 Claims, 10 Drawing Sheets

U.S. PATENT DOCUMENTS

| | | | |
|---|---|---|---|
| 6,705,331 | B2 | 3/2004 | Sato et al. |
| 6,783,599 | B2 | 8/2004 | Gale et al. |
| 6,864,458 | B2 | 3/2005 | Widmann et al. |
| 7,410,545 | B2 | 8/2008 | Matsubara |
| 2003/0178047 | A1 | 9/2003 | Hirae |
| 2004/0040177 | A1 | 3/2004 | Izumi |
| 2004/0261817 | A1 | 12/2004 | Araki et al. |

FOREIGN PATENT DOCUMENTS

| | | |
|---|---|---|
| JP | 62-169420 | 7/1987 |
| JP | 3-145130 | 6/1991 |
| JP | 3-503975 | 9/1991 |
| JP | 3-261142 | 11/1991 |
| JP | 4-134822 | 5/1992 |
| JP | 4-79422 | 7/1992 |
| JP | 7-240356 | 9/1995 |
| JP | 8-262388 | 10/1996 |
| JP | 8-318181 | 12/1996 |
| JP | 9-152272 | 6/1997 |
| JP | 11-31673 | 2/1999 |
| JP | 11-111658 | 4/1999 |
| JP | 11-340185 | 12/1999 |
| JP | 2001-53051 | 2/2001 |
| JP | 3343013 | 8/2002 |
| JP | 2003-275696 | 9/2003 |
| KR | 91-7593 | 5/1991 |

OTHER PUBLICATIONS

Notice of Allowance issued Nov. 27, 2008 in corresponding Korean Patent Application No. 2007-0067309.

Liehr et al., "Ultraclean Semiconductor Processing Technology and Surface Chemical Cleaning and Passivation," vol. 386, pp. 3-4, 1995.

Office Action issued Jan. 28, 2010 in connection with corresponding Taiwanese Patent Application No. 96104743.

Japanese Office Action issued Sep. 21, 2010 in connection with corresponding Japanese Patent Application No. 2006-108801.

Office Action issued Mar. 30, 2011 in related U.S. Appl. No. 11/696,464 of Naozumi Fujiwara et al., filed Apr. 4, 2007.

Each item of information contained in this Information Disclosure Statement was first cited in a communication from a foreign patent office in a counterpart application and this communication was not received by any individual designated in section 1.56(c) more than thirty days prior to the filing of this Information Disclosure Statement, Dec. 29, 2010.

* cited by examiner

F I G. 1
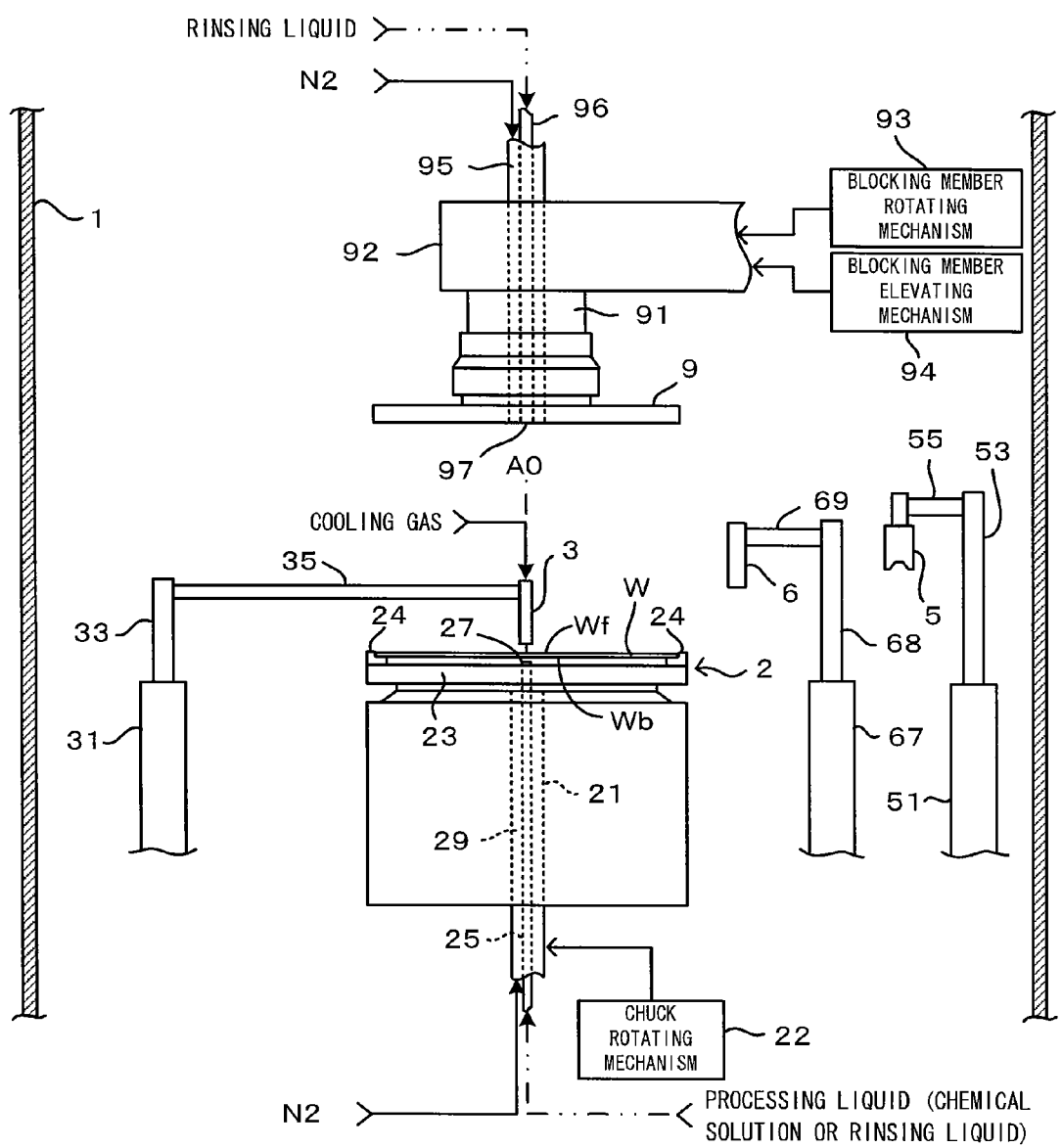

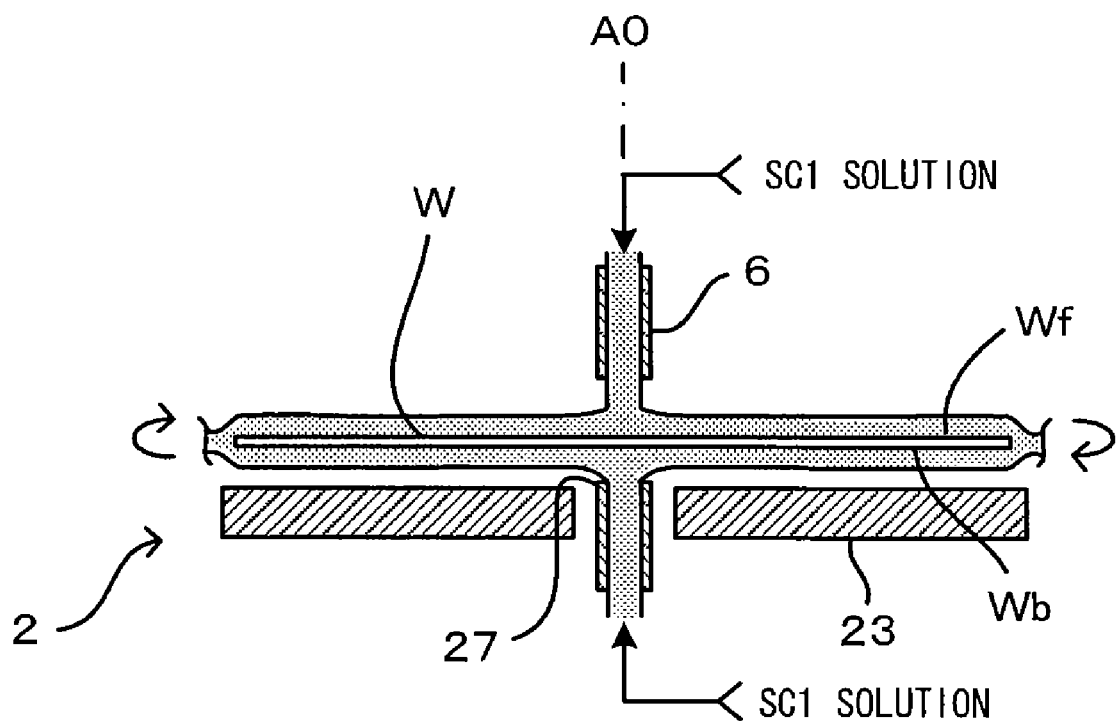
F I G. 6

LIQUID FILM FORMATION

LIQUID FILM FREEZING

REMOVAL OF FROZEN FILM

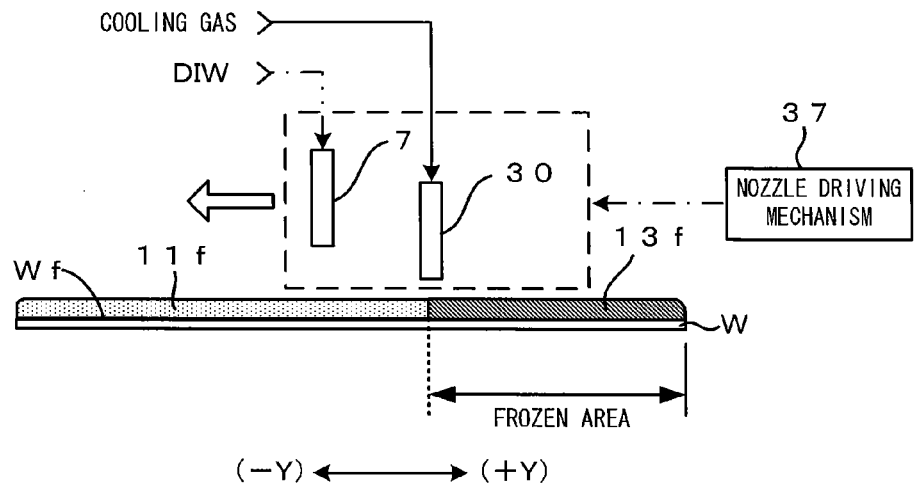
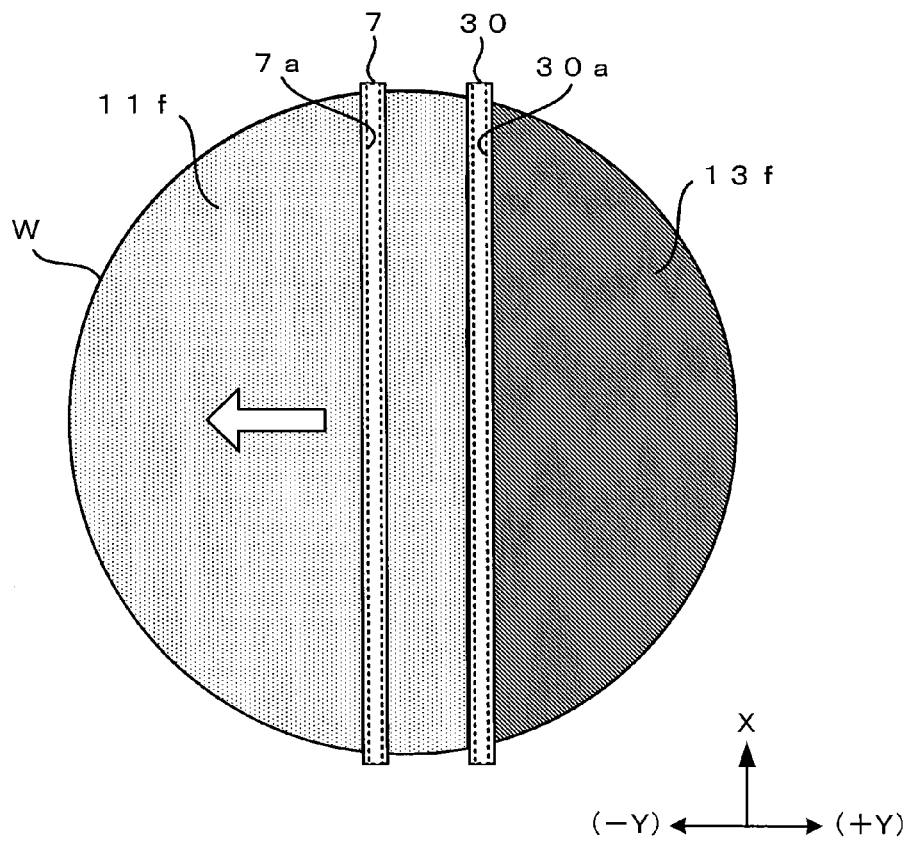

LIQUID FILM FORMATION ON BACK SURFACE

LIQUID FILM FORMATION ON FRONT SURFACE AND FREEZING OF LIQUID FILMS ON BOTH SURFACES

SUBSTRATE PROCESSING APPARATUS, LIQUID FILM FREEZING METHOD AND SUBSTRATE PROCESSING METHOD

CROSS REFERENCE TO RELATED APPLICATION

The disclosure of Japanese Patent Application No. 2006-248181 filed Sep. 13, 2006 including specification, drawings and claims is incorporated herein by reference in its entirety.

BACKGROUND OF THE INVENTION

1. Field of the Invention

The present invention relates to a substrate processing apparatus, a liquid film freezing method, and a substrate processing method using the liquid film freezing method which freeze a liquid film formed on a surface of a substrate including semiconductor wafers, glass substrates for photomask, glass substrates for liquid crystal display, glass substrates for plasma display, substrates for FED (field emission display), substrates for optical disks, substrates for magnetic disks, substrates for magnet-optical disks, etc.

2. Description of the Related Art

Conventionally used is a technique of freezing a liquid film as it is maintained adhering to a substrate surface by cooling a substrate as one of a substrate processing. Particularly this freezing technique is used as part of a substrate cleaning processing. That is, as devices typified by semiconductors have finer patterns, more advanced functions and higher precision, it becomes increasingly difficult to remove fine contaminants such as particles adhering to the substrate surface without destroying patterns formed on the substrate surface. And so, particles adhering to the substrate surface are removed in the following manner utilizing the freezing technique described above.

First, a liquid film is formed on a substrate surface by supplying liquid to the substrate surface. Subsequently, the liquid film is frozen by cooling the substrate. Thus, a frozen film is formed on the substrate surface to which particles adhere. Finally, the frozen film is removed from the substrate surface, whereby the particles are removed from the substrate surface together with the frozen film.

Here, the following liquid film freezing method may be used for freezing the liquid film formed on the substrate surface. In the apparatus described in JP-A-3-145130 for instance, a substrate is housed in a processing chamber and the substrate is supported on a pedestal (seating stage). A removal fluid such as steam and ultra pure vapor is then supplied to a surface of the substrate. This forms a liquid film of the removal fluid on the substrate surface. Following this, cooling gas whose temperature is lower than the freezing temperature of the removal fluid is introduced into the processing chamber so that the cooling gas circulates inside the processing chamber. This freezes the liquid film which is present on the substrate surface and forms a frozen layer (frozen film) all over the substrate surface.

SUMMARY OF THE INVENTION

By the way, in the apparatus described in JP-A-3-145130, the cooling gas is introduced into the processing chamber and made circulate inside the processing chamber to thereby form the frozen layer on the substrate surface. This allows the cooling gas to cool not only the substrate but peripheral members as well (hereinafter referred simply as the "substrate peripheral members") which are located around the substrate, including a substrate holder such as the pedestal, down to or below the freezing temperature or to a temperature near the freezing temperature. As a result, the substrate peripheral members are damaged by the cold energy and the durability of the substrate peripheral members deteriorates, which is a problem. Particularly in the event that a liquid film needs be frozen and a substrate needs be treated with a chemical solution within the same processing chamber, for prevention of corrosion of the substrate peripheral members by the chemical solution, it is necessary to form the substrate peripheral members of a material which is chemical-resistant. For this reason, the substrate peripheral members are often made mainly of chemical-resistant resin materials. However, where the substrate peripheral members are made of such resin materials, it is difficult to secure the resistance against cold energy of the substrate peripheral members, and therefore, leaving a risk that the durability of the substrate peripheral members will deteriorate significantly depending upon the number of times liquid film freezing is performed, the processing time, etc.

The invention has been made in light of the problems described above, and an object thereof is to provide a substrate processing apparatus, liquid film freezing method and a substrate processing method using the liquid film freezing method with which it is possible to form a frozen film all over the substrate surface while suppressing deterioration of the durability of the substrate peripheral members.

According to a first aspect of the present invention, there is provided a substrate processing apparatus, comprising: a substrate holder which holds a substrate approximately horizontally in a condition that a substrate surface on which a liquid film is formed is directed toward above; a cooling gas discharger which discharges a cooling gas whose temperature is lower than the freezing point of a liquid which composes the liquid film toward a local section of the surface of the substrate which is held by the substrate holder; and a relative moving mechanism which relatively moves the cooling gas discharger relative to the substrate and parallel to the substrate surface, wherein the relative moving mechanism relatively moves the cooling gas discharger relative to the substrate while the cooling gas discharger discharges the cooling gas, whereby a frozen film is formed all over the substrate surface.

According to a second aspect of the present invention, there is provided a liquid film freezing method, comprising: a cooling gas discharging step of discharging, while a substrate is held approximately horizontally in a condition that a substrate surface on which a liquid film is formed is directed toward above, a cooling gas whose temperature is lower than the freezing point of a liquid which composes the liquid film from a cooling gas discharger toward a local section of the substrate surface; and a relatively moving step, executed in parallel with the cooling gas discharging step, of relatively moving the cooling gas discharger relative to the substrate and parallel to the substrate surface to thereby form a frozen film all over the substrate surface.

According to a third aspect of the present invention, there is provided a substrate processing method, comprising: a liquid film freezing step of freezing a liquid film on a substrate surface in the liquid film freezing method according to the second aspect of the present invention; and a film removal step of removing a frozen film formed by the liquid film freezing step on the substrate surface from the substrate surface.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BRIEF DESCRIPTION OF THE DRAWINGS

FIG. 1 is a diagram showing a substrate processing apparatus of a first embodiment of the invention.

FIG. 6 is a diagram showing a modification of the substrate processing apparatus of the invention.

FIGS. 8A and 8B are drawings of a substrate processing apparatus according to a third embodiment of the invention.

DETAILED DESCRIPTION OF THE PREFERRED EMBODIMENTS

First Embodiment

Figure 2:
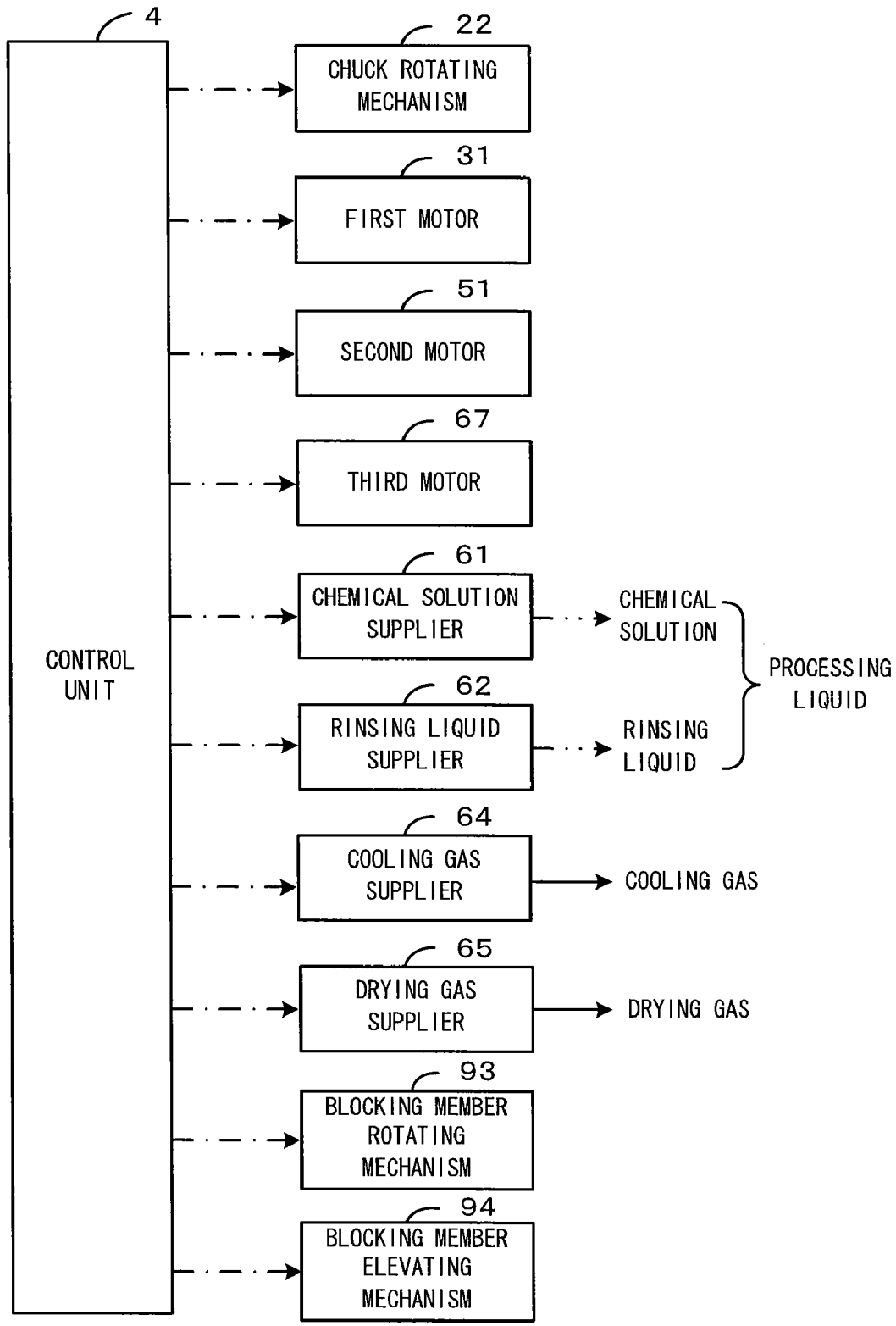
FIG. 2 is a block diagram showing a control construction of the substrate processing apparatus shown in FIG. 1.

FIG. 1 is a diagram showing a substrate processing apparatus of a first embodiment of the invention. FIG. 2 is a block diagram showing a control construction of the substrate processing apparatus shown in FIG. 1. This substrate processing apparatus is a single wafer type substrate processing apparatus that is used for the cleaning processes for the purpose of removing contaminants such as particles adhering to a surface Wf of a substrate W such as semiconductor wafer. More specifically, this is an apparatus which forms a liquid film on the substrate surface Wf on which fine patterns are formed, then freezes the liquid film, and then removes the liquid film which has been processed freezing (frozen film) from the substrate surface Wf, that is, the apparatus performs a series of cleaning process (liquid film formation+freezing the liquid film+film removal) to a substrate W.

This substrate processing apparatus includes a processing chamber 1 which has a processing space inside in which a cleaning process is performed to a substrate W. In the processing chamber 1, a spin chuck 2, a cooling gas discharge nozzle 3, a two-fluid nozzle 5, chemical solution discharge nozzle 6, and a blocking member 9 are provided. The spin chuck (corresponding to the "substrate holder" of the invention) 2 holds the substrate W in an approximately horizontally such that the substrate surface Wf is directed toward above and rotates the substrate W. The cooling gas discharge nozzle (corresponding to the "cooling gas discharger" of the invention) 3 discharges cooling gas for freezing a liquid film toward the surface Wf of the substrate W held by the spin chuck 2. The two-fluid nozzle 5 supplies droplets of processing liquid to the substrate surface Wf. The chemical solution discharge nozzle 6 discharges chemical solution toward the surface Wf of the substrate W held by the spin chuck 2. The blocking member 9 is disposed facing the surface Wf of the substrate W held by the spin chuck 2. As processing liquid, chemical solution or rinsing liquid such as purified water and DIW (deionized water) or the like are used.

A rotation column 21 of the spin chuck 2 is linked to a rotation shaft of a chuck rotating mechanism 22 which contains a motor. The spin chuck 2 is rotatable about a rotation center A0 when driven by the chuck rotating mechanism 22. A disk-shaped spin base 23 is linked by a fastening component such as a screw to a top end portion of the rotation column 21 as one integrated unit. The spin base 23 therefore rotates about the rotation center A0 when driven by the chuck rotating mechanism 22 in response to an operation command received from a control unit 4 (FIG. 2) which controls the apparatus as a whole. Thus, in this embodiment, the chuck rotating mechanism 22 functions as the "rotating unit" of the invention.

Plural chuck pins 24 for holding the substrate W at the rim thereof are disposed upright in the vicinity of the rim of the spin base 23. There may be three or more chuck pins 24 to securely hold the disk-shaped substrate W, and the chuck pins 24 are arranged at equal angular intervals along the rim of the spin base 23. Each chuck pin 24 comprises a substrate support part which supports the substrate W at the rim thereof from below and a substrate holding part which presses the substrate W at the outer peripheral edge surface thereof to hold the substrate W. Each chuck pin 24 is structured so as to be capable of switching between a pressing state that the substrate holding part presses the substrate W at the outer peripheral edge surface thereof and a released state that the substrate holding part stays away from the outer peripheral edge surface of the substrate W.

The plural chuck pins 24 are in the released state while the substrate W is being transferred to the spin base 23 but in the pressing state for cleaning of the substrate W. When in the pressing state, the plural chuck pins 24 hold the substrate W at the rim thereof and keep the substrate approximately horizontally at a predetermined distance from the spin base 23. The substrate W is held with its front surface (pattern-formed surface) Wf directed toward above and its back surface Wb toward below.

A first motor 31, which functions as the "driver" of the invention, is disposed at a place outward from the spin chuck 2. A first rotary shaft 33 is connected to the first motor 31. Further, a first arm 35 extending horizontally is linked to the first rotary shaft 33, and the cooling gas discharge nozzle 3 is attached to the end of the first arm 35. The first motor 31 is driven in accordance with an operation command from the control unit 4, whereby the first arm 35 swings around the first rotary shaft 33.

Figure 3A:
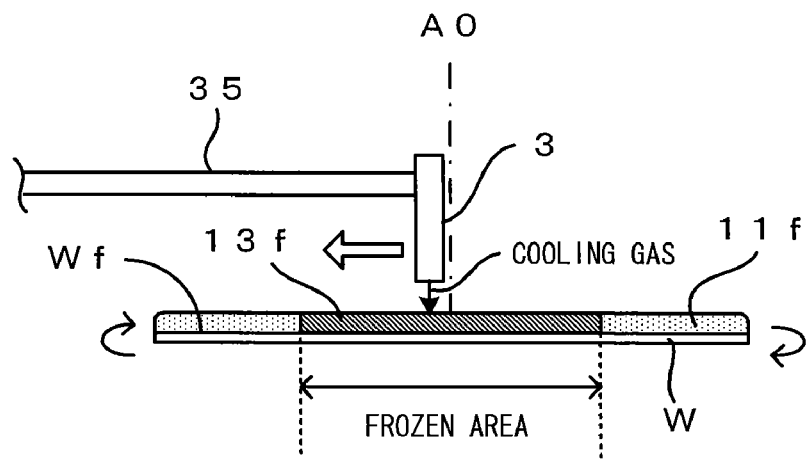
FIGS. 3A and 3B are diagrams showing an operation of the cooling gas discharge nozzle equipped in the substrate processing apparatus shown in FIG. 1.
Figure 3B:
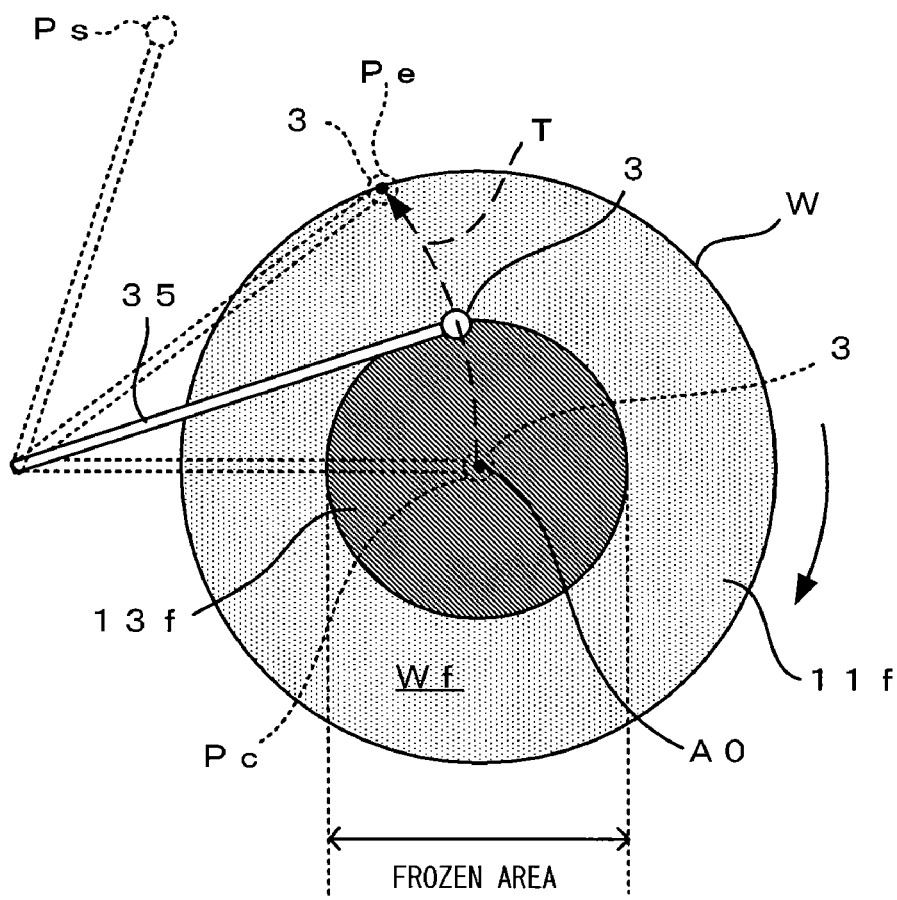

FIGS. 3A and 3B are diagrams showing an operation of the cooling gas discharge nozzle equipped in the substrate processing apparatus shown in FIG. 1. To be more specific, FIG. 3A is a side view of the cooling gas discharge nozzle and FIG. 3B is a plan view thereof. When the first motor 31 is driven to swing the first arm 35, the cooling gas discharge nozzle 3 moves along a moving trajectory T in FIG. 3B while facing the substrate surface Wf, that is, along the trajectory T from a rotational center position Pc of the substrate W toward an edge position Pe of the substrate W. The rotational center position Pc is located above the rotation center A0 of the substrate W facing the substrate surface Wf. Further, the cooling gas discharge nozzle 3 is movable to a standby position Ps which is located away from the substrate W and sideward thereof. Thus, in this embodiment, the first motor 31 functions as the "relative moving mechanism" which relatively moves the cooling gas discharge nozzle 3 relative to the substrate W and parallel to the substrate surface Wf.

The cooling gas discharge nozzle 3 is connected to a cooling gas supplier 64 (FIG. 2). The cooling gas supplier 64 supplies cooling gas to the cooling gas discharge nozzle 3 in accordance with an operation command from the control unit 4. Hence, when the cooling gas discharge nozzle 3 is positioned facing the substrate surface Wf, the cooling gas is discharged from the cooling gas discharge nozzle 3 toward the substrate surface Wf locally. Therefore, in a state that the cooling gas is discharged from the cooling gas discharge nozzle 3, the control unit 4 moves the cooling gas discharge nozzle 3 along the moving trajectory T while rotating the substrate W, whereby the cooling gas is supplied to the entire substrate surface Wf. With this, when a liquid film is formed on the substrate surface Wf as described hereinafter, the entire liquid film 11f can be frozen to form a frozen film 13f on the entire substrate surface Wf.

The height of the cooling gas discharge nozzle 3 from the substrate surface Wf is different depending upon the supplying amount of the cooling gas, but may be set not more than 50 mm for instance and preferably about several mm. Such height of the cooling gas discharge nozzle 3 from the substrate surface Wf and the supplying amount of the cooling gas is determined experimentally from a viewpoint of (1) coldness the cooling gas has gives the liquid film efficiently, (2) the liquid film is frozen stably without distorting the surface of the liquid film by the cooling gas.

A gas whose temperature is below the freezing point of the liquid which composes the liquid film 11f formed on the substrate surface Wf, for example, nitrogen gas, oxygen gas, clean air, and the like are used as the cooling gas. It is easy to eliminate contaminants contained in the cooling gas by a filter and the like before supplying the gas to the substrate surface Wf when such cooling gas is used. Therefore, it is possible to prevent from contaminating the substrate surface Wf in freezing the liquid film 11f. In this embodiment, in a state that the liquid film 11f with DIW is formed on the substrate surface Wf the cooling gas is discharged from the cooling gas discharge nozzle 3 toward the substrate surface Wf, whereby the liquid film 11f is frozen. Therefore, the cooling gas adjusted to the temperature below the freezing point of DIW which composes the liquid film 11f is used.

Further, a second motor 51 is disposed at a place outward from the spin chuck 2. A second rotary shaft 53 is connected to the second motor 51. Further, a second arm 55 is linked to the second rotary shaft 53, and the two-fluid nozzle 5 is attached to the end of the second arm 55. The second motor 51 is driven in accordance with an operation command from the control unit 4, whereby the two-fluid nozzle 5 swings around the second rotary shaft 53. The two-fluid nozzle 5 discharges droplets of processing liquid for cleaning the substrate surface Wf, the droplets generated by mixing processing liquid and gas.

Figure 4:
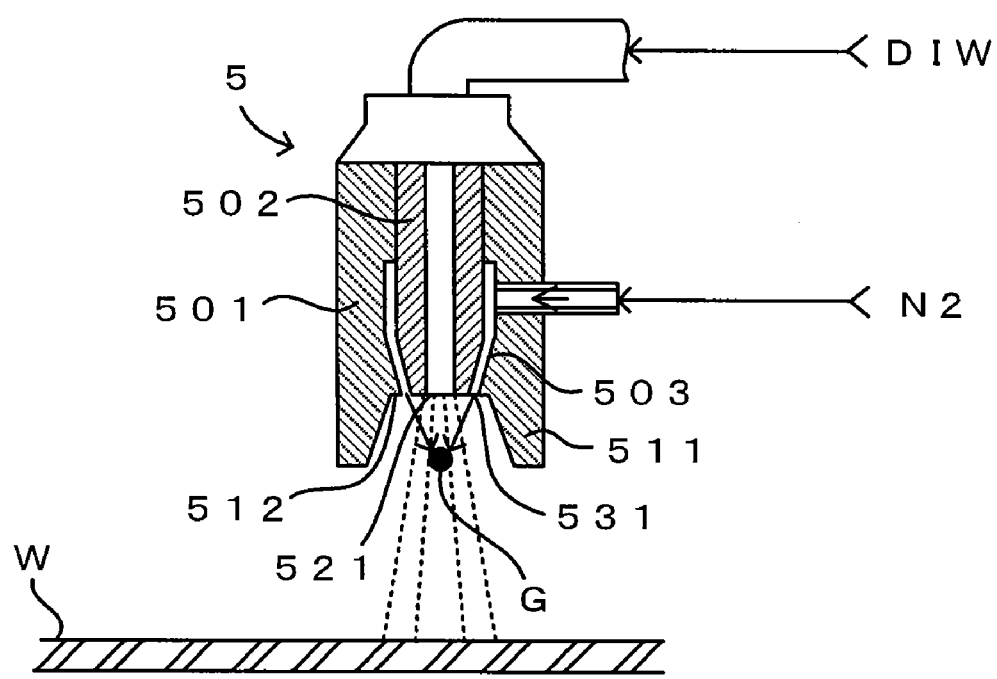
FIG. 4 is a drawing which shows the structure of a two-fluid nozzle.

FIG. 4 is a drawing which shows the structure of a two-fluid nozzle. This two-fluid nozzle is the two-fluid nozzle of the so-called external mixing type which collides the DIW as a processing liquid and the nitrogen gas in air (outside the nozzle) and generates droplets of the DIW. A processing liquid discharge nozzle 502, which has a processing liquid discharging outlet 521 inside a body section 501, is inserted in the two-fluid nozzle 5. The processing liquid discharging outlet 521 is disposed at a top surface part 512 of an umbrella part 511 of the two-fluid nozzle 5. Hence, supplied to the processing liquid discharge nozzle 502, the DIW is discharged toward the substrate W from the processing liquid discharging outlet 521.

Further, a gas discharge nozzle 503 is disposed in the vicinity of the processing liquid discharge nozzle 502, defining a ring-shaped gas channel which surrounds the processing liquid discharge nozzle 502. The tip end of the gas discharge nozzle 503 is tapered progressively thin, and the opening of this nozzle is opposed against the surface of the substrate W. Hence, supplied to the gas discharge nozzle 503, the nitrogen gas is discharged toward the substrate W from the gas discharging outlet 531 of the gas discharge nozzle 503.

The track of thus discharged nitrogen gas intersects that of the DIW discharged from the processing liquid discharging outlet 521. That is, the liquid (DIW) flow from the processing liquid discharging outlet 521 collides with the gas (nitrogen gas) flow at a collision section G which is located within a mixing region. The gas flow is discharged so as to converge at the collision section G. The mixing region is a space at the bottom end of the body section 501. Hence, the nitrogen gas colliding the DIW quickly changes the DIW into droplets, immediately near the discharging direction in which the DIW is discharged from the processing liquid discharging outlet 521. Cleaning droplets are generated in this manner.

Description is to be continued by referring back to FIG. 1. The rotation column 21 of the spin chuck 2 is formed by a hollow shaft. A processing liquid supply pipe 25 is inserted in the rotation column 21 to thereby supply the processing liquid to the back surface Wb of the substrate W. The processing liquid supply pipe 25 extends to a position which is in the vicinity of the bottom surface (back surface Wb) of the substrate W which is held by the spin chuck 2, and the tip end of the processing liquid supply pipe 25 mounts a processing liquid nozzle 27 which discharges the processing liquid toward a central area in the bottom surface of the substrate W. The processing liquid supply pipe 25 is connected to a chemical solution supplier 61 and a rinsing liquid supplier 62. A chemical solution such as an SC1 solution (a liquid mixture of aqueous ammonia and a hydrogen peroxide solution) from the chemical solution supplier 61, or a rinsing liquid such as DIW from the rinsing liquid supplier 62 is supplied selectively to the processing liquid supply pipe 25.

A clearance between the inner wall surface of the rotation column 21 and the outer wall surface of the processing liquid supply pipe 25 forms a cylindrical gas supply passage 29. This gas supply passage 29 is connected to a dry gas supplier 65, so that nitrogen gas as the dry gas can be supplied to a space between the spin base 23 and the substrate back-surface Wb. Although nitrogen gas is supplied from the dry gas supplier 65 in this embodiment, air or another inert gas may be discharged.

A third motor 67 is disposed at a place outward from the spin chuck 2. A third rotary shaft 68 is connected to the third motor 67. Further, a third arm 69 extending horizontally is linked to the third rotary shaft 68, and the chemical solution discharge nozzle 6 is attached to the end of the third arm 69. The third motor 67 is driven in accordance with an operation command from the control unit 4, whereby the chemical solution discharge nozzle 6 moves in reciprocation between a discharging position above the rotation center A0 of the substrate W and a stand-by position away sideward from the discharging position. The chemical solution discharge nozzle 6 is connected to the chemical solution supplier 61. A chemical solution such as the SC1 solution is pressure fed to the chemical solution discharge nozzle 6 in accordance with an operation command from the control unit 4.

Further disposed above the spin chuck 2 is a disk-shaped blocking member 9 which has an opening at its center. The back surface (bottom) of the blocking member 9 is a substrate-facing surface which faces the front substrate surface Wf approximately parallel, and the size in plan view of this surface is equal to or greater than the diameter of the substrate W. The blocking member 9 is attached approximately horizontally to the lower end of a support shaft 91 which is shaped approximately like a circular cylinder, and an arm 92 extending in the horizontal direction holds the support shaft 91 so that the support shaft 91 can rotate about a vertical axis which penetrates the center of the substrate W. Further, a blocking member rotating mechanism 93 and a blocking member elevating mechanism 94 are connected to the arm 92.

The blocking member rotating mechanism 93 rotates the support shaft 91 in response to an operation command from the control unit 4 about the vertical axis which penetrates the center of the substrate W. Further, the blocking member rotating mechanism 93 is structured so as to rotate the blocking member 9 at about the same rotation speed in the same direction as the substrate W in accordance with rotation of the substrate W which is held by the spin chuck 2.

Further, the blocking member elevating mechanism 94 moves the blocking member 9 toward the spin base 23 to face the spin base 23, and conversely, away therefrom in accordance with an operation command from the control unit 4. Specifically, the control unit 4 causes the blocking member 9 to move upward to a separated position (position shown in FIG. 1) above the spin chuck 2 upon loading and unloading the substrate W into and from the substrate processing apparatus by actuating the blocking member elevating mechanism 94. On the other hand, the control unit 4 causes the blocking member 9 to move downward to a specified facing position set very close to the surface Wf of the substrate W held by the spin chuck 2 upon performing a predetermined processing to the substrate W.

The support shaft 91 is formed hollow and accepts penetration by a gas supply path 95 which links to the opening of the blocking member 9. The gas supply path 95 is connected with the drying gas supplier 65 so that nitrogen gas is supplied from the drying gas supplier 65. In this embodiment, nitrogen gas is supplied via the gas supply path 95 to the space which is formed between the blocking member 9 and the front surface Wf of the substrate, during drying of the substrate W after cleaning. In addition, a liquid supply path 96 linking to the opening of the blocking member 9 is inserted inside the gas supply path 95, and a nozzle 97 is coupled with the lower end of the liquid supply path 96. The liquid supply path 96 is connected with the rinsing liquid supplier 62. When the rinsing liquid is supplied from the rinsing liquid supplier 62, the nozzle 97 can jet out the rinsing liquid toward the front surface Wf of the substrate.

Figure 5:
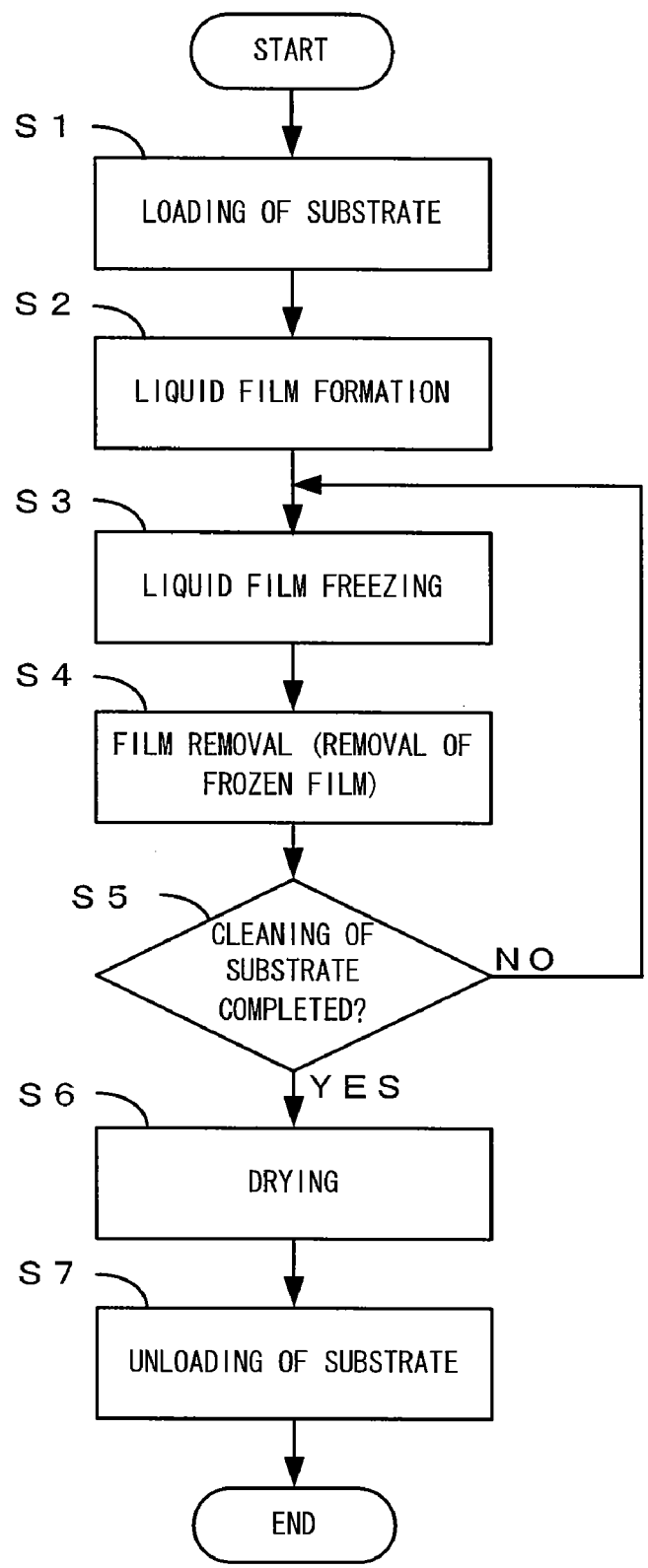
FIG. 5 is a flow chart of the operation in the substrate processing apparatus shown in FIG. 1.

The cleaning operation in the substrate processing apparatus having the structure above will now be described with reference to FIG. 5. FIG. 5 is a flow chart of the operation in the substrate processing apparatus shown in FIG. 1. In this apparatus, upon loading of the substrate W into inside the apparatus, the control unit 4 controls the respective sections of the apparatus and a series of cleaning processing (liquid film formation+liquid film freezing+film removal) is performed upon the substrate W. In some instances, fine patterns are formed on the front surface Wf of the substrate. In other words, the front surface Wf of the substrate is a pattern-formed surface. Noting this, in this embodiment, the substrate W is loaded into inside the processing chamber 1 with the front surface Wf of the substrate directed toward above, and held by the spin chuck 2 (Step S1). Meanwhile, the blocking member 9 is located at the separated position, which obviates interference with the substrate W.

As the spin chuck 2 holds an unprocessed substrate W, the blocking member 9 descends to the opposed position and becomes positioned close to the front surface Wf of the substrate. The front surface Wf of the substrate is therefore covered as it is located in the vicinity of the substrate-facing surface of the blocking member 9, and is blocked from the surrounding atmosphere around the substrate W. The control unit 4 then drives the chuck rotating mechanism 22, whereby the spin chuck 2 rotates and the nozzle 97 supplies the DIW to the front surface Wf of the substrate. Centrifugal force which develops as the substrate W rotates acts upon the DIW supplied to the front surface Wf of the substrate, and the DIW spreads uniformly outward in the diameter direction of the substrate W and partially flies away off from the substrate. This controls the thickness of the liquid film uniform all across the entire front surface Wf of the substrate, and forms the liquid film (aqueous film) which has a predetermined thickness all over the front surface Wf of the substrate (Step S2; liquid film forming step). As for liquid film formation, to drain the front surface Wf of the substrate off of the DIW supplied thereto as described above is not an essential requirement. For instance, in a condition that the substrate W has stopped rotating or is rotating relatively slowly, a liquid film may be formed on the front surface Wf of the substrate without draining the substrate W off of the DIW. Thus, in this embodiment, the nozzle 97 functions as the "first liquid film forming unit" of the invention.

After the liquid film forming step, the control unit 4 positions the blocking member 9 to the separated position and moves the cooling gas discharge nozzle 3 to a cooling gas supply start position, namely the rotational center position Pc, from the stand-by position Ps. While discharging the cooling gas toward the front surface Wf of the rotating substrate W, the cooling gas discharge nozzle 3 then moves gradually toward the edge position Pe of the substrate W. As a result, as shown in FIGS. 3A and 3B, of the surface region of the front surface Wf of the substrate, an area where the liquid film 11f has been frozen (frozen area) expands toward the periphery edge from the center of the front surface Wf of the substrate, and a frozen film 13f is formed all over the front surface Wf of the substrate (Step S3; liquid film freezing step). While it is possible to suppress an uneven distribution of the liquid film thickness and accordingly form the frozen film 13f all over the front surface Wf of the rotating substrate since the substrate W remains rotating while the cooling gas discharge nozzle 3 moves, if the substrate W rotates at a high speed, air flows developed by the rotations of the substrate W diffuse the cooling gas which is ejected from the cooling gas discharge nozzle 3 and the efficiency of freezing of the liquid film worsens, and therefore, the rotation speed of the substrate W at the liquid film freezing step is set to 1 through 300 rpm for example. The rotation speed of the substrate W is determined considering the traveling speed of the cooling gas discharge nozzle 3, the temperature and the flow rate of the discharged gas and the thickness of the liquid film as well.

When the liquid film freezing step is executed in this way, the cubic volume of the liquid film entering between the front surface Wf of the substrate and the particles increases (when water of 0° C. becomes ice of 0° C., the volume thereof increases by about 1.1 times), and particles move away extremely short distances from the front surface Wf of the substrate. This reduces the adherence between the front surface Wf of the substrate and the particles and further separates the particles from the front surface Wf of the substrate. When this occurs, even though there are fine patterns formed on the front surface Wf of the substrate, the pressure upon the patterns owing to the cubical expansion of the liquid film is equal in all directions, that is, the force applied upon the patterns gets offset. Hence, it is possible to remove only the particles off from the front surface Wf of the substrate, focusing selectively on the particles and without peeling off or destroying the patterns.

Upon freezing of the liquid film, the control unit 4 moves the cooling gas discharge nozzle 3 to the stand-by position Ps and positions the blocking member 9 to the opposed position. The nozzle 97 and the processing liquid nozzle 27 supply the DIW as the rinsing liquid respectively to the front surface Wf and the back surface Wb of the substrate W before the frozen film 13f has been melted. This permits the DIW defrost the frozen film which is on the front surface Wf of the substrate. Further, the centrifugal force which develops as the substrate W rotates acts upon the frozen film 13f and the DIW supplied to the front surface Wf of the substrate. In consequence, the frozen film 13f containing the particles is removed from the front surface Wf of the substrate and discharged to outside the substrate (Step S4; film removal step). In addition, as for the back surface Wb of the substrate W as well, the DIW spreads all over the back surface as the substrate W rotates, whereby the back surface Wb of the substrate W is rinsed. Thus, in this embodiment, the nozzle 97 and the processing liquid nozzle 27 function as the "film remover" of the invention. At the film removal step, it is preferable that the blocking member 9 rotates as the substrate W rotates. The blocking member 9 is therefore drained off of the liquid component adhering thereto, and it is possible to prevent the processing liquid in the mist form from intruding from around the substrate into the space which is generated between the blocking member 9 and the front surface Wf of the substrate.

Alternatively, the frozen film may be defrosted and removed at the film removal step as follows. That is, after freezing of the liquid film, the control unit 4, with the blocking member 9 located at the separated position, makes the two-fluid nozzle 5 supply DIW droplets to the front surface Wf of the substrate while pivoting over the substrate W. This collides droplets with particles adhering to the front surface Wf of the substrate, and due to the kinetic energy of the droplets, the particles are physically removed (physical cleaning). This makes it easy to remove particles off from the front surface Wf of the substrate and realizes excellent cleaning of the front surface Wf of the substrate. In this modification, the two-fluid nozzle 5 functions as the "film remover" of the invention.

After the film removal step thus finishes and cleaning of the substrate W (liquid film formation+liquid film freezing+film removal) completes (YES at Step S5), drying of the substrate W is carried out. On the other hand, depending on the surface condition of the front surface Wf of the substrate which is a surface-to-be-processed or the particle diameters and the type of particles which must be removed, the particles may not be removed sufficiently off from the front surface Wf of the substrate through one cleaning. When this occurs (NO at Step S5), the film removal step is followed by re-execution of the liquid film freezing step and the film removal step. That is, after the film removal step, the rinsing liquid (DIW) remains adhering to the front surface Wf of the substrate. The front surface Wf of the substrate is therefore coated with a liquid film of the rinsing liquid, even without formation of a new liquid film on the front surface Wf of the substrate. Hence, if the liquid film freezing step is executed after the film removal step, a frozen film of the rinsing liquid is formed. When the frozen film is removed at the film removal step, the particles adhering to the front surface Wf of the substrate are removed together with the frozen film off from the front surface Wf of the substrate. Through repeated execution of the film removal step and the liquid film freezing step over a predetermined number of times, the particles are removed off from the front surface Wf of the substrate. The number of re-executions may be determined in advance as a processing recipe, and the film removal step and the liquid film freezing step may be repeated over thus determined number of times according to a processing recipe which is chosen appropriately.

Upon cleaning of the substrate W, the control unit 4 increases the rotation speeds of the motors for the chuck rotating mechanism 22 and the blocking member rotating mechanism 93 and makes the substrate W and the blocking member 9 rotate at high speeds. This attains drying (spin drying) of the substrate W (Step S6). During this drying processing, nitrogen gas is supplied on the gas supply paths 95 and 29, thereby generating a nitrogen gas atmosphere in the space which is sandwiched between the blocking member 9 and the front surface Wf of the substrate and the space which is sandwiched between the spin base 23 and the back surface Wb of the substrate. This facilitates drying of the substrate W and shortens the drying time. After the drying processing, the substrate W stops rotating and the processed substrate W is taken out from the processing chamber 1 (Step S7).

As described above, in this embodiment, the cooling gas discharge nozzle 3 discharges, toward a local section of the front surface Wf of the substrate, the cooling gas whose temperature is lower than the freezing point of the liquid which forms the liquid film 11f formed on the front surface Wf of the substrate. The cooling gas discharge nozzle 3 then moves between the rotational center position Pc of the substrate W and the edge position Pe of the substrate W while the substrate W remain rotating, whereby the frozen film 13f is formed all over the front surface Wf of the rotating substrate. This limits a section receiving supply of the cooling gas to a very narrow area on the front surface Wf of the substrate, which in turn minimizes a decrease of the temperatures of the substrate peripheral members such as the spin chuck 2. It is therefore possible to form the frozen film 13f all over the front surface Wf of the rotating substrate while suppressing deterioration of the durability of the substrate peripheral members. As a result, even when the substrate peripheral members are made of a resin material (a chemical-resistant resin material) with which it is hard to secure the resistance against cold energy, degradation of the material of the substrate peripheral members can be suppressed.

Further, this embodiment makes it easy to deal with frost formed inside the processing chamber 1 since the liquid film 11f is frozen while the cooling gas is discharged toward a local section of the front surface Wf of the substrate. In other words, since frost grows only at the cooling gas discharge nozzle 3 and surrounding areas, it is easier to suppress frost as compared to where the cooling gas is circulated inside the processing chamber 1. For example, growth of frost is discouraged relatively easily when nozzle side surfaces of the cooling gas discharge nozzle 3 are covered with a thermal insulating material. Alternatively, the cooling gas discharge nozzle 3 may have a double pipe structure that carries the cooling gas on the inner side (through a central section) and carries a gas on the outer side (at the periphery edge), which easily suppresses formation of frost.

Further, according to this embodiment, the film removal step and the liquid film freezing step are executed continuously inside the same processing chamber 1, the throughput is improved. In addition, since the substrate W is cooled locally in this embodiment, it is possible to shorten the time necessary for removal of the frozen film than conventional techniques which demand circulating cooling gas inside a processing chamber for cooling of a substrate W do. That is, according to the conventional techniques, cold energy accumulates at substrate peripheral members including a substrate holder during cooling of a substrate W and it is therefore necessary to increase the temperatures of the substrate peripheral members as well during removal of a frozen film. In contrast, according to the invention, it is possible to remove the frozen film off from the substrate W in a relatively short period of time since cold energy does not accumulate at the substrate peripheral members beyond a necessary extent. Further, since the liquid film forming step is carried out inside the same processing chamber 1 according to this embodiment, it is possible to perform the series of cleaning processing (liquid film formation+liquid film freezing+film removal) upon the substrate W at a high efficiency as an integrated process. Moreover, as the series of cleaning processing is possible without transporting the substrate W, it is unnecessary to control the schedule of substrate transportation.

Further, according to this embodiment, it is possible to repeatedly perform the liquid film freezing step and the film removal step inside the same processing chamber 1 for the predetermined times. It is therefore possible to securely remove off from the front surface Wf of the substrate those particles which can not be removed from the front surface Wf of the substrate through only single execution of the liquid film freezing step and the film removal step.

Further, according to this embodiment, execution of the film removal step is started before the frozen film has been melted. This makes it possible to prevent particles fallen off from the front surface Wf of the substrate at the liquid film freezing step from re-adhering to the front surface Wf of the substrate again as the frozen film gets melted. It is therefore possible to efficiently remove the particles together with the frozen film off from the front surface Wf of the substrate through execution of the film removal step, which is advantageous in improving the particle removal rate.

Although the DIW is supplied to the front surface Wf of the substrate for removal of the frozen film in the embodiment described above, the frozen film may be removed through chemical cleaning of the front surface Wf of the substrate as shown in FIG. 6. In other words, after freezing of the liquid film, the control unit 4 positions the chemical solution discharge nozzle 6 at the discharging position and the SC1 solution is pressure fed into the chemical solution discharge nozzle 6. This makes the chemical solution discharge nozzle 6 feed the SC1 solution to the front surface Wf of the substrate. Since the zeta potential (electrokinetic potential) at the surface of the solid matter in the SC1 solution has a relatively large value, when the area between the front surface Wf of the substrate and the particles on the front surface Wf of the substrate is filled with the SC1 solution, significant repulsive force acts between the front surface Wf of the substrate and the particles. This makes it even easier for the particles to fall off from the front surface Wf of the substrate and achieves effective removal of the particles from the front surface Wf of the substrate. In this modification, the chemical solution discharge nozzle 6 functions as the "film remover" of the invention.

Further, at the same time as supply of the SC1 solution to the front surface Wf of the substrate, the processing liquid nozzle 27 may supply the SC1 solution to the back surface Wb of the substrate W. This realizes effective removal of even those contaminants adhering to the back surface Wb of the substrate off from the substrate due to the chemical cleaning effect of the SC1 solution. After cleaning with the SC1 solution, the DIW is supplied to the front surface Wf and the back surface Wb of the substrate W and rinsing with the DIW is attained.

Second Embodiment

Figure 7A:
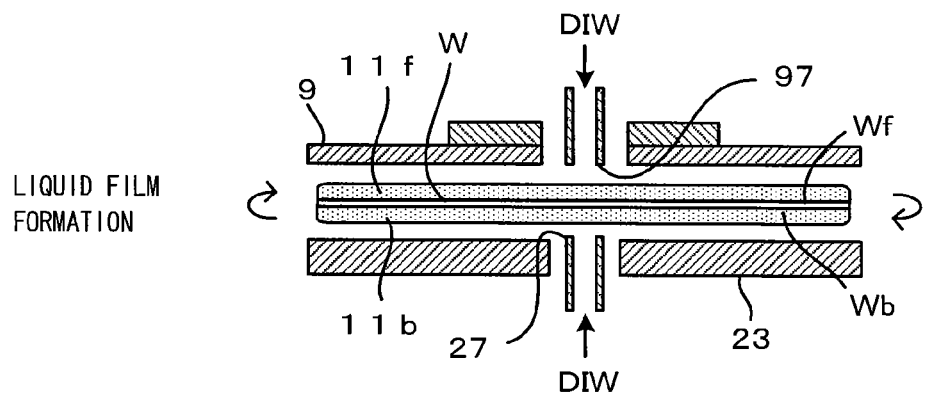
FIGS. 7A, 7B and 7C are drawings of a substrate processing apparatus according to a second embodiment of the invention.
Figure 7B:
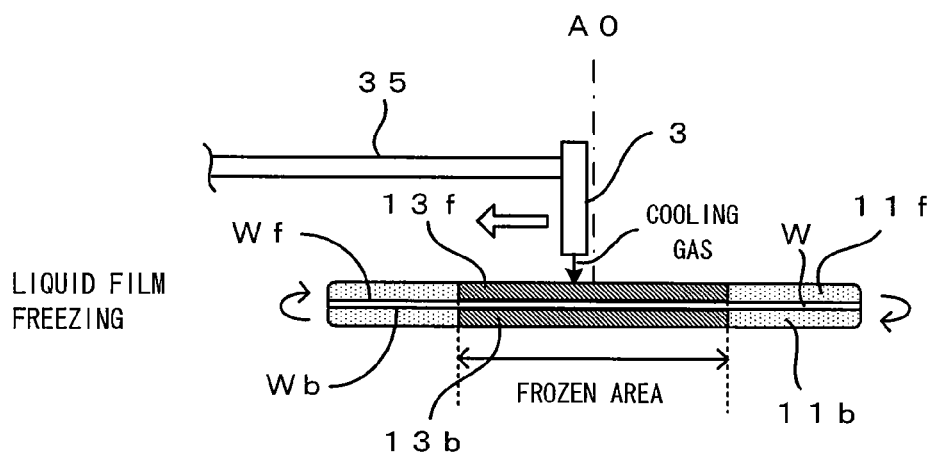
Figure 7C:
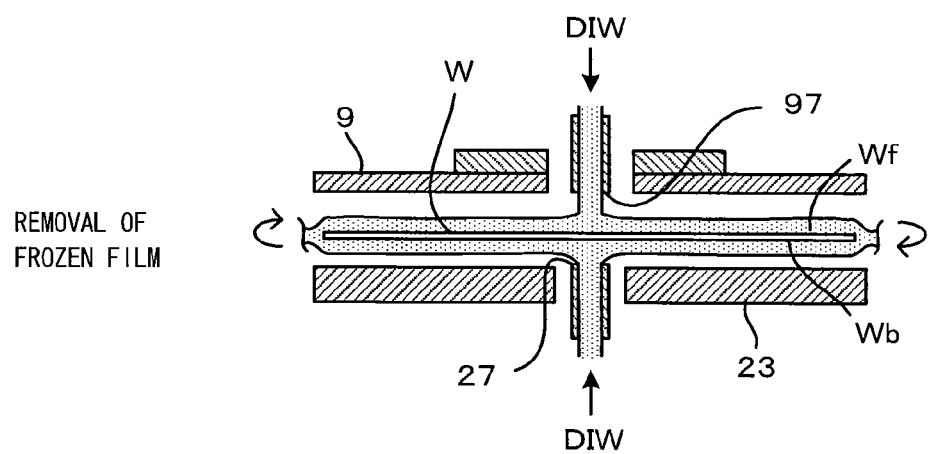

FIGS. 7A, 7B and 7C are drawings of a substrate processing apparatus according to a second embodiment of the invention. A major difference of the substrate processing apparatus according to the second embodiment from the first embodiment is that a frozen film (back surface side frozen film) is formed on the back surface Wb of the substrate as well, not only on the front surface Wf of the substrate. The other structure and operation are basically similar to those according to the first embodiment, and therefore, will be denoted at the same reference symbols but will not be described.

In this embodiment, concurrently with formation of the liquid film on the front surface Wf of the substrate, a liquid film (back surface side liquid film) 11b is formed on the back surface Wb of the substrate (FIG. 7A). To be more specific, the nozzle 97 supplies the DIW to the front surface Wf of the substrate while the substrate W rotates, during which the processing liquid nozzle 27 supplies the DIW to the back surface Wb of the substrate. As a result, the liquid films (aqueous films) 11f and 11b which have a predetermined thickness are formed entirely over the front surface Wf and the back surface Wb of the substrate. Thus, in this embodiment, the processing liquid nozzle 27 functions as the "back surface side liquid film forming unit" of the invention.

Following this, as in the first embodiment, the cooling gas discharge nozzle 3 jets out the cooling gas toward a local section of the front surface Wf of the substrate. The cooling gas discharge nozzle 3 then gradually moves toward the edge position Pe of the substrate W from the rotational center position Pc of the substrate W while the substrate W rotates. At this stage, the cold energy of the cooling gas supplied toward the front surface Wf of the substrate is transmitted to the back surface side liquid film 11b via the substrate W. Since a silicon substrate in particular has a relatively large coefficient of thermal conductivity, the cold energy is efficiently transmitted to the back surface side liquid film 11b via the substrate W. This expands an area where the back surface side liquid film 11b has been frozen (frozen area) inside the surface region of the back surface Wb of the substrate, while simultaneously expanding the frozen area on the front surface Wf of the substrate, and forms a frozen film (back surface side frozen film) 13b on the entire back surface Wb of the substrate (FIG. 7B). As a result, the entire front surface Wf and the entire back surface Wb of the substrate are covered with the front surface side frozen film 13f and the back surface side frozen film 13b, respectively. This weakens the adherence between particles and the substrate W not only at the front surface Wf but at the back surface Wb as well.

As the liquid films 11f and 11b are frozen in this manner, the DIW is supplied as the rinsing liquid to the front surface Wf and the back surface Wb of the substrate W, whereby the particles are removed together with the frozen films 13f and 13b off from the front surface Wf and the back surface Wb of the substrate W (FIG. 7C). Alternatively, the frozen films 13f and 13b may be removed by physical cleaning using droplets from the two-fluid nozzle 5 or chemical cleaning with the SC1 solution.

As described above, according to this embodiment, since a section receiving supply of the cooling gas is limited to a local area on the front surface Wf of the substrate, it is possible to form the frozen films 13f and 13b on the front surface Wf and the back surface Wb of the substrate W while suppressing deterioration of the durability of the substrate peripheral members. Further, since the frozen films 13f and 13b are formed on the front surface Wf and the back surface Wb of the substrate W at the same time, the frozen films 13f and 13b are formed on the both surfaces of the substrate W in approximately the same period of time as that required for formation of the frozen film 13f only on the front surface Wf of the substrate.

Further, according to this embodiment, removal of the front surface side frozen film 13f from the front surface Wf of the substrate and removal of the back surface side frozen film 13b as well from the back surface Wb of the substrate are executed. Hence, even when there are particles adhering to the back surface Wb of the substrate, it is possible to effectively remove the particles off from the back surface Wb of the substrate W in a similar fashion to that for the front surface Wf of the substrate. This attains effective removal of the particles from the front surface Wf and the back surface Wb of the substrate W and favorable cleaning of the entire substrate. Further, since the back surface side liquid film 11b is frozen at the same time that the front surface side liquid film 11f is frozen, it is possible to clean the front surface Wf and the back surface Wb of the substrate W without lowering the throughput. That is, since it is possible to clean not only the front surface Wf of the substrate but the back surface Wb of the substrate as well without reversing the substrate W or otherwise appropriate operation, it is possible to clean the front surface Wf and the back surface Wb of the substrate W in approximately the same period of time as that required for cleaning of the front surface Wf of the substrate.

Third Embodiment

In the first and the second embodiments described above, the cooling gas discharge nozzle 3 moves between the rotational center position Pc of the substrate W and the edge position Pe of the substrate W while the substrate W remain rotating, thereby moving the cooling gas discharge nozzle 3 relative to the substrate W. However, the structure for moving the cooling gas discharge nozzle relative to the substrate W is not limited to this. For example, as shown in FIGS. 8A and 8B, the cooling gas discharge nozzle may move relative to the substrate W without rotating the substrate W (third embodiment).

FIGS. 8A and 8B are drawings of a substrate processing apparatus according to the third embodiment of the invention. To be more specific, FIG. 8A is a side view and FIG. 8B is a plan view. In this apparatus, the substrate holder such as the spin chuck 2 holds the substrate W approximately horizontally in a condition that the front surface Wf of the substrate is directed toward above. Further, a cooling gas discharge nozzle 30 (which corresponds to the "cooling gas discharger" of the invention) is disposed in the vicinity of and opposed against the front surface Wf of the substrate. At the tip end (lower end) of the cooling gas discharge nozzle 30, there is a slit-like discharge outlet 30a which extends in an X-direction (corresponding to the "first direction" of the invention). The cooling gas discharge nozzle 30 is connected to a cooling gas supplier (not shown), and jets out at the discharge outlet 30a toward a local area on the front surface Wf of the substrate the cooling gas from the cooling gas supplier in a form of a band. The discharge outlet 30a is equal to or longer than the plane size (substrate diameter) of the front surface Wf of the substrate in the X-direction.

The cooling gas discharge nozzle 30 is arranged so as to able to freely move in an Y-direction which is orthogonal to the X-direction but parallel to the front surface Wf of the substrate, and when driven by a nozzle driving mechanism 37, can reciprocally move in the Y-direction. In this embodiment, as the cooling gas discharge nozzle 30 moves to the left-hand side (−Y) in FIGS. 8A and 8B in the Y-direction, liquid film freezing processing described later is performed. This (−Y) direction corresponds to the "second direction" of the invention. The nozzle driving mechanism 37 may be a known mechanism such as a lead screw mechanism which moves the cooling gas discharge nozzle 30 by means of motor drive along a guide extending in the Y-direction and a ball screw. Thus, in this embodiment, the nozzle driving mechanism 37 functions as the "relative moving mechanism" of the invention.

A DIW discharge nozzle 7 is disposed, opposed against the front surface Wf of the substrate, on the downstream side (−Y) to the cooling gas discharge nozzle 30 in the direction the cooling gas discharge nozzle 30 moves, to thereby form a liquid film on the front surface Wf of the substrate. The DIW discharge nozzle 7 is connected to a DIW supplier (not shown) and jets out the DIW from the DIW supplier toward the front surface Wf of the substrate. At the tip end (lower end) of the DIW discharge nozzle 7, there is a slit-like discharge outlet 7a which extends in the X-direction so that the DIW discharge nozzle 7 discharges the DIW in a form of a band toward the front surface Wf of the substrate. The discharge outlet 7a is equal to or longer than the plane size (substrate diameter) of the front surface Wf of the substrate in the X-direction.

The DIW discharge nozzle 7 is capable of moving in the (−Y) direction in synchronization to the cooling gas discharge nozzle 30. That is, a link mechanism (not shown) links the DIW discharge nozzle 7 with the cooling gas discharge nozzle 30, and when the nozzle driving mechanism 37 operates, the cooling gas discharge nozzle 30 and the DIW discharge nozzle 7 move in the (−Y) direction as one integrated unit. This maintains the gap between the cooling gas discharge nozzle 30 and the discharging position for the DIW discharge nozzle 7 to a predetermined separation distance while the cooling gas discharge nozzle 30 is moving. As a result, liquid film forming processing described later and the liquid film freezing processing are carried out while maintaining this predetermined separation distance, and hence, it is possible to stabilize the both processing. While an independent driver may be disposed for the DIW discharge nozzle 7 to move the DIW discharge nozzle 7 in association with the cooling gas discharge nozzle 30, where the single driver moves the DIW discharge nozzle 7 and the cooling gas discharge nozzle 30 as one integrated unit, the drive structure may be simple.

In the substrate processing apparatus having such a structure, as the nozzle driving mechanism 37 operates, the DIW discharge nozzle 7 and the cooling gas discharge nozzle 30 move at a constant speed in the (−Y) direction. Further, the DIW discharge nozzle 7 and the cooling gas discharge nozzle 30 discharge the DIW and the cooling gas, respectively. This realizes coating of the front surface Wf of the substrate with the DIW from the upstream side (+Y) to the downstream side (−Y) in the direction the DIW discharge nozzle 7 moves, as the DIW discharge nozzle 7 moves. In consequence, on the downstream side (−Y) in the moving direction relative to the cooling gas discharge nozzle 30, the liquid film 11f is formed on the front surface Wf of the substrate. Thus, in this embodiment, the DIW discharge nozzle 7 functions as the "second liquid film forming unit" of the invention. Further, as the nozzle 7 and the cooling gas discharge nozzle 30 move, the cooling gas discharge nozzle 30 jets out the cooling gas toward the front surface Wf of the substrate on which the liquid film 11f is formed and the liquid film 11f gets frozen. This gradually expands in the (−Y) direction an area where the liquid film 11f has been frozen (frozen area) inside the surface region of the front surface Wf of the substrate, and the frozen film 13f is formed on the entire front surface Wf of the substrate.

As described above, this embodiment permits formation of the frozen film 13f on the entire front surface Wf of the substrate utilizing the simple structure which does not require rotating the substrate W. Further, since the liquid film 11f is formed at the same time that the liquid film 11f is frozen (formation of the frozen film 13f), the processing efficiency is high through the liquid film forming processing and the liquid film freezing processing.

Further, since the film removal processing is executed in a similar manner to that according to the first embodiment after freezing the liquid film, it is possible to efficiently perform the series of cleaning processing (liquid film formation+liquid film freezing+film removal) upon the substrate W. In short, after simultaneously performing the liquid film forming processing and the liquid film freezing processing upon the substrate W which is held by the spin chuck 2, the processing liquid is supplied to the substrate W while the substrate W keeps rotating, thereby removing the frozen film 13f off from the front surface Wf of the substrate and hence shortening the processing time which is required for the cleaning.

Fourth Embodiment

Figure 9A:
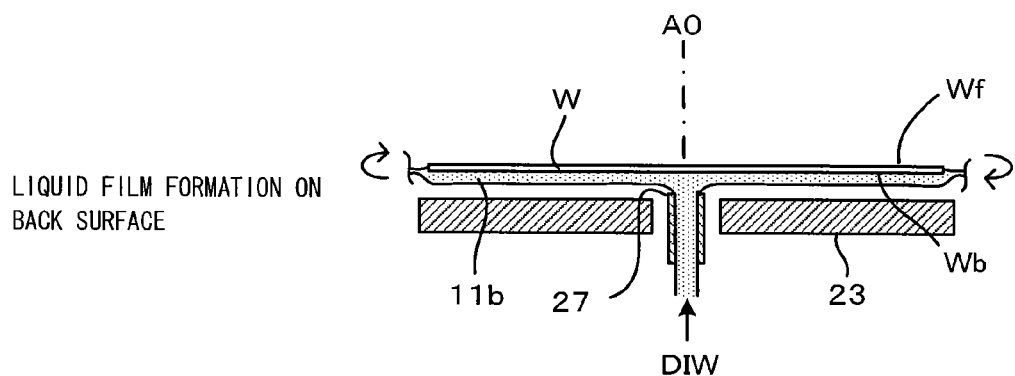
FIGS. 9A and 9B are drawings of a substrate processing apparatus according to a fourth embodiment of the invention.
Figure 9B:
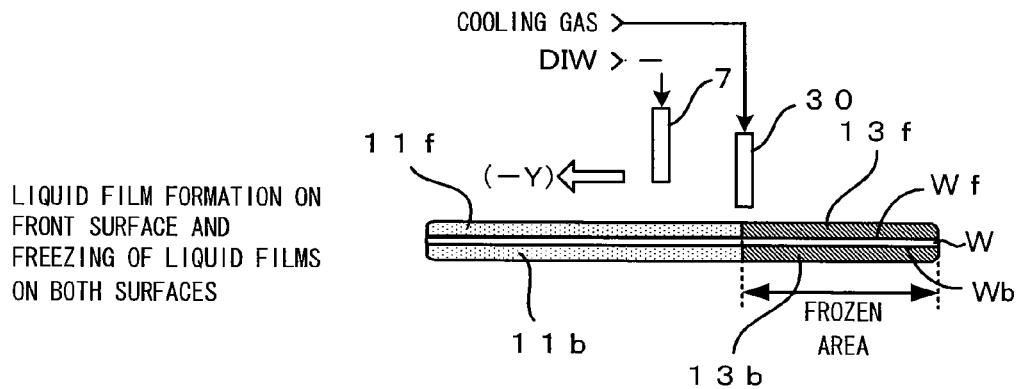

FIGS. 9A and 9B are drawings of a substrate processing apparatus according to a fourth embodiment of the invention. A major difference of the substrate processing apparatus according to the fourth embodiment from the third embodiment is that a frozen film (back surface side frozen film) is formed on the back surface Wb of the substrate as well, not only on the front surface Wf of the substrate. The other structure and operation are basically similar to those according to the third embodiment, and therefore, will be denoted at the same reference symbols but will not be described.

In the fourth embodiment, prior to formation of the liquid film on the front surface Wf of the substrate, the liquid film (back surface side liquid film) 11b is formed on the back surface Wb of the substrate (FIG. 9A). To be more specific, the spin chuck 2 holds the substrate W and the substrate W rotates about the rotation center A0. The processing liquid nozzle 27 then supplies the DIW to the back surface Wb of the substrate, the DIW spreads all over the back surface, and the back surface side liquid film 11b is formed on the back surface Wb of the substrate.

Following this, in a similar fashion to that in the third embodiment, the DIW discharge nozzle 7 and the cooling gas discharge nozzle 30 scan in the (−Y) direction while the DIW discharge nozzle 7 and the cooling gas discharge nozzle 30 discharge the DIW and the cooling gas, respectively. As a result, the DIW from the DIW discharge nozzle 7 forms the liquid film (front surface side liquid film) 11f on the front surface Wf of the substrate while the cooling gas from the cooling gas discharge nozzle 30 freezes the front surface side liquid film 11f. Meanwhile, the cold energy of the cooling gas supplied toward the front surface Wf of the substrate is transmitted to the back surface side liquid film 11b via the substrate W. This expands in the (−Y) direction an area where the back surface side liquid film 11b has been frozen (frozen area) inside the surface region of the back surface Wb of the substrate, while simultaneously expanding the frozen area on the front surface Wf of the substrate (FIG. 9B). In consequence, the front surface side frozen film 13f and the back surface side frozen film 13b are formed at the same time respectively on the entire front surface Wf and the entire back surface Wb of the substrate W.

As described above, as a section receiving supply of the cooling gas is limited to a local area on the front surface Wf of the substrate, it is possible to form the frozen films 13f and 13b on the front surface Wf and the back surface Wb of the substrate W while suppressing deterioration of the durability of the substrate peripheral members. Further, as the frozen films 13f and 13b are formed on the front surface Wf and the back surface Wb of the substrate W at the same time, the frozen films 13f and 13b are formed on the both surfaces of the substrate W in approximately the same period of time as that required for formation of the frozen film 13f only on the front surface Wf of the substrate.

Further, in this embodiment as well, through execution of the film removal processing upon the front surface Wf and the back surface Wb of the substrate W after freezing of the liquid films, it is possible to effectively remove particles off from the front surface Wf and the back surface Wb of the substrate W and favorably clean the both surfaces of the substrate W.

<Others>

The invention is not limited to the embodiments described above but may be modified in various manners in addition to the embodiments above, to the extent not deviating from the object of the invention. For instance, in the embodiments above, supplying the liquid (DIW) to the front surface Wf of the substrate and forming the liquid film on the front surface Wf of the substrate are executed within the processing chamber 1. However, a substrate W on the front surface Wf of which a liquid film is already formed may be loaded into inside the processing chamber 1.

Further, in the embodiments above, although the liquid films on the substrate W are formed with the DIW, the liquid films may be formed with other rinsing liquid. For instance, the liquid films may be formed with carbonated water, a hydrogen-saturated water, ammonium water having a diluted concentration (which may for instance be about 1 ppm), hydrochloric acid having a diluted concentration, etc. Alternatively, the liquid films may be formed with a chemical solution other than a rinsing liquid. For example, during repeated execution of the liquid film freezing step and the film removal step using a chemical solution, liquid films of the chemical solution which remain adhering to the substrate W at the film removal step are frozen at the liquid film freezing step.

Further, in the embodiments above, although the operation immediately proceeds to the film removal step after freezing of the liquid films, the timing of proceeding to the film removal step may be pushed back for adjustment of the tact time. In this instance, the frozen films function as protection films although the substrate W must remain on standby in a state the frozen films are formed inside the apparatus. This prevents contamination of the front surface Wf of the substrate without fail.

Further, in the embodiments above, the cleaning with the SC1 solution (SC1 cleaning) as chemical cleaning which principally exerts a chemical cleaning effect upon the surface Wf of the substrate is executed. However, the chemical cleaning performed according to the invention is not limited to the SC1 cleaning. For example, the chemical cleaning may be wet cleaning which uses, as a processing liquid, an alkaline solution, an acidic solution, an organic solvent, a surface active surfactant or the like other than the SC1 solution or wet cleaning which uses a proper combination of these as a processing liquid.

Further, in the embodiments above, the cleaning with droplets using the two-fluid nozzle (droplets cleaning) as physical cleaning which principally exerts a physical effect upon the surface Wf of the substrate is executed. However, the physical cleaning performed according to the invention is not limited to the droplets cleaning. The physical cleaning may for example be scrub cleaning which cleans the substrate W with a brush, a sponge or the like brought into contact with the surface Wf of the substrate, ultrasonic cleaning which cleans the substrate W by vibrating and separating particles adhering to the surface Wf of the substrate utilizing ultrasonic vibrations or by means of an action upon the surface Wf of the substrate by cavitations, air bubbles or the like formed in a processing liquid, etc. Further alternatively, a frozen liquid film may be removed off from the surface Wf of the substrate through cleaning of the surface Wf of the substrate which combines depending upon necessity physical cleaning and chemical cleaning.

Further, in the embodiments above, although the droplets cleaning using the two-fluid nozzle of the so-called external mixing type is executed in performing the physical cleaning with droplets discharged from the two-fluid nozzle, this is not limiting. A two-fluid nozzle of the so-called internal mixing type may be used to execute the droplets cleaning. That is, a processing liquid and gas may be mixed inside the two-fluid nozzle to generate cleaning droplets, and the droplets may be discharged toward the substrate W at a discharging outlet of the nozzle.

Further, in the first and the second embodiments above, although the cooling gas discharge nozzle 3 scans only once from the rotational center position Pc of the substrate W toward the edge position Pe of the substrate W to thereby freeze the liquid film, this is not limiting. Where the liquid film is relatively thick for instance, the cooling gas discharge nozzle 3 may scan between the rotational center position Pc of the substrate W and the edge position Pe of the substrate W over plural times in order to freeze the liquid film. However, for uniform freezing of the liquid film, the frozen area preferably expands gradually under control.

Figure 10:
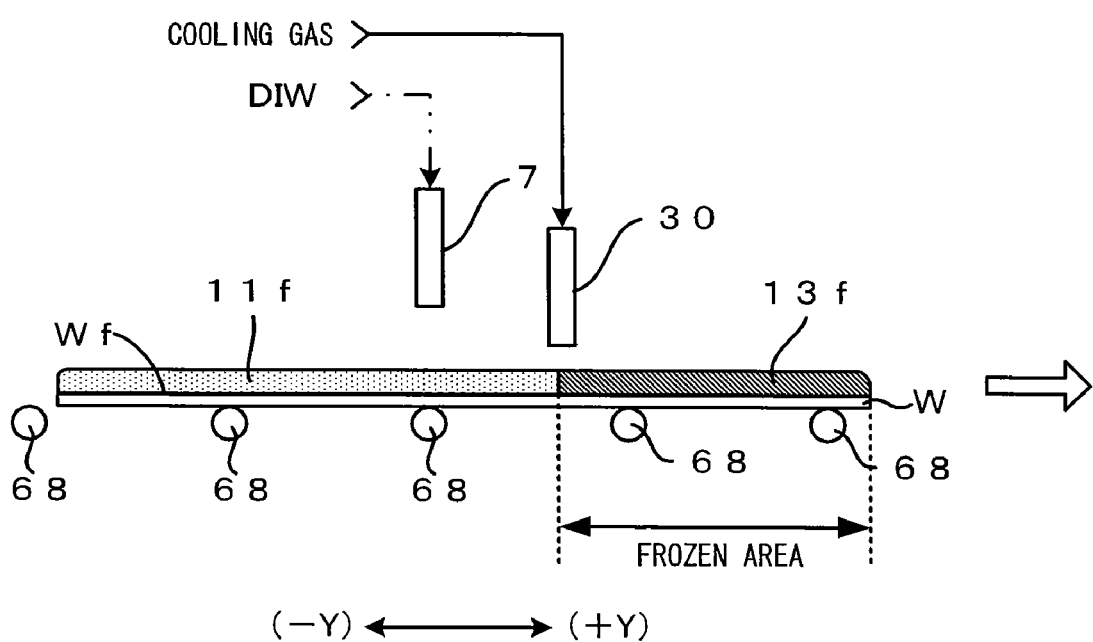
FIG. 10 is a diagram showing a modification of the substrate processing apparatus of the invention.

Further, in the third embodiment above, the DIW discharge nozzle 7 and the cooling gas discharge nozzle 30 move while the substrate W is held still, the substrate W may be transported while the DIW discharge nozzle 7 and the cooling gas discharge nozzle 30 stay fixed. For instance, in the event that a frozen film needs be formed all over the front surface Wf of a rectangular substrate such as a glass substrate for liquid crystal display, plural transportation rollers 68 may be disposed in the direction (+Y) of a transportation direction and the DIW discharge nozzle 7 and the cooling gas discharge nozzle 30 may be fixed as shown in FIG. 10. While the substrate W is transported in the transportation direction (+Y) in this substrate processing apparatus, basic operations are exactly the same as those according to the embodiments described above, which attain similar effects. Alternatively, liquid films may be frozen while moving both the cooling gas discharge nozzle 30 and the substrate W, or liquid films may be formed while moving both the DIW discharge nozzle 7 and the substrate W.

Further, although the embodiments above have described an example of applying the substrate processing apparatus which has a function to freeze a liquid film formed on a front surface Wf of a substrate according to the invention to cleaning processing to remove contaminants, such as particles, adhering to the front surface Wf of the substrate, the invention is not limited only to such an application. For instance, a liquid film (frozen film) frozen by using a substrate processing apparatus and a liquid film freezing method according to the invention is used as a protection film to protect the substrate surface. That is, a liquid film is formed on the front surface Wf of the substrate, and the liquid film is frozen so that the frozen film functions as a protection film of the front surface Wf of the substrate, thereby protecting the front surface Wf of the substrate against contamination from the ambient atmosphere around the substrate. This allows the substrate W to be stored or remain on standby while preventing contamination of the front surface Wf of the substrate by the frozen film acting as a protection film.

The present invention is applicable to a substrate processing apparatus, a liquid film freezing method, and a substrate processing method using the liquid film freezing method which freeze a liquid film formed on a surface of a substrate in general including semiconductor wafers, glass substrates for photomask, glass substrates for liquid crystal display, glass substrates for plasma display, substrates for FED (field emission display), substrates for optical disks, substrates for magnetic disks, substrates for magnet-optical disks, etc.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A liquid film freezing method, comprising:
   a liquid film forming step of forming a liquid film on an entire substrate surface;
   a cooling gas discharging step of discharging a cooling gas directly onto the liquid film, while the substrate is held approximately horizontally with the substrate surface on which the liquid film is formed directed toward above, the temperature of the cooling gas being lower than the freezing point of a liquid that composes the liquid film, from a cooling gas discharger toward a local section of the substrate surface to freeze only a partial area of the liquid film;
   a rotating step of rotating the substrate;
   a moving step, executed in parallel with the cooling gas discharging step and the rotating step, of moving the cooling gas discharger while rotating the substrate, parallel to the substrate surface, to thereby expand the area where the liquid film has been frozen to form a frozen film all over the substrate surface;
   wherein the cooling gas discharger is moved along a moving trajectory between a rotation center position of the substrate and an edge position of the substrate, whereby the frozen area expands all over the substrate surface.

2. A substrate processing method, comprising:
   a liquid film freezing step of freezing a liquid film on a substrate surface in the liquid film freezing method of claim 1; and
   a film removal step of removing a frozen film formed by the liquid film freezing step on the substrate surface from the substrate surface.

3. The substrate processing method of claim 2, wherein execution of the film removal step is started before the frozen film has been melted.

4. The substrate processing method of claim 2, wherein
   at the film removal step, the frozen film is removed by supplying a processing liquid to the substrate surface, and
   the liquid film freezing step and the film removal step are executed in turn repeatedly a predetermined number of times.

* * * * *